United States Patent
Naniwa et al.

(10) Patent No.: US 11,348,887 B2
(45) Date of Patent: May 31, 2022

(54) RADIO-FREQUENCY MODULE AND COMMUNICATION DEVICE

(71) Applicant: Murata Manufacturing Co., Ltd., Kyoto (JP)

(72) Inventors: Yusuke Naniwa, Kyoto (JP); Hideki Muto, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 8 days.

(21) Appl. No.: 17/161,882

(22) Filed: Jan. 29, 2021

(65) Prior Publication Data
US 2021/0151397 A1 May 20, 2021

Related U.S. Application Data

(63) Continuation of application No. PCT/JP2019/034056, filed on Aug. 30, 2019.

(30) Foreign Application Priority Data

Oct. 5, 2018 (JP) .............................. JP2018189853

(51) Int. Cl.
*H01L 23/66* (2006.01)
*H01L 23/31* (2006.01)
(Continued)

(52) U.S. Cl.
CPC .............. *H01L 23/66* (2013.01); *H01L 23/31* (2013.01); *H01L 23/5384* (2013.01);
(Continued)

(58) Field of Classification Search
CPC ... H01L 23/5386; H01L 23/31; H01L 23/538; H01L 23/66; H01L 23/552; H01L 23/3121; H01L 25/16; H04B 1/0057; H04B 1/18
(Continued)

(56) References Cited

U.S. PATENT DOCUMENTS

2006/0284300 A1   12/2006   Nishizawa et al.
2013/0300614 A1   11/2013   Machida
(Continued)

FOREIGN PATENT DOCUMENTS

JP   2003-229510 A   8/2003
JP   2007-281160 A   10/2007
(Continued)

OTHER PUBLICATIONS

International Search Report for PCT/JP2019/034056 dated Nov. 19, 2019.
Written Opinion for PCT/JP2019/034056 dated Nov. 19, 2019.

*Primary Examiner* — Alexander O Williams
(74) *Attorney, Agent, or Firm* — Pearne & Gordon LLP

(57) ABSTRACT

A radio-frequency module includes: a module substrate having first and second main surfaces; a semiconductor IC having third and fourth main surfaces and mounted on the first main surface with the third main surface between the module substrate and the fourth main surface; and first and second electrodes extending perpendicularly to the first main surface. The cross-sectional area of the second electrodes is smaller than the cross-sectional area of the first electrodes. The semiconductor IC viewed in plan has first and second sides parallel to each other and third and fourth sides parallel to each other. The first electrodes are distributed over a first region between the first side and a side facing the first side and a second region between the second side and a side facing the second side. The second electrodes are in a third region between the third side and a side facing the third side.

20 Claims, 7 Drawing Sheets

(51) Int. Cl.
*H01L 23/538* (2006.01)
*H01L 23/552* (2006.01)
*H01Q 1/22* (2006.01)

(52) U.S. Cl.
CPC ........ *H01L 23/5386* (2013.01); *H01L 23/552* (2013.01); *H01Q 1/2283* (2013.01)

(58) Field of Classification Search
USPC ........................................................ 257/774
See application file for complete search history.

(56) References Cited

U.S. PATENT DOCUMENTS

| | | | |
|---|---|---|---|
| 2018/0068978 A1* | 3/2018 | Jeng | H01L 25/0652 |
| 2018/0076184 A1* | 3/2018 | Chen | H01L 23/49816 |
| 2018/0337148 A1* | 11/2018 | Baek | H01L 25/0657 |
| 2019/0035716 A1 | 1/2019 | Kita | |
| 2019/0193379 A1* | 6/2019 | Gkinosatis | B32B 27/20 |
| 2019/0214355 A1 | 7/2019 | Nishikawa | |
| 2019/0267339 A1 | 8/2019 | Murase | |
| 2020/0035625 A1* | 1/2020 | Wang | H01L 23/49827 |
| 2021/0272929 A1* | 9/2021 | Tsai | H01L 23/5385 |

FOREIGN PATENT DOCUMENTS

| | | |
|---|---|---|
| WO | 2005/076351 A1 | 8/2005 |
| WO | 2012/096354 A1 | 7/2012 |
| WO | 2017/170535 A1 | 10/2017 |
| WO | 2018/110393 A1 | 6/2018 |
| WO | 2018/110513 A1 | 6/2018 |

* cited by examiner

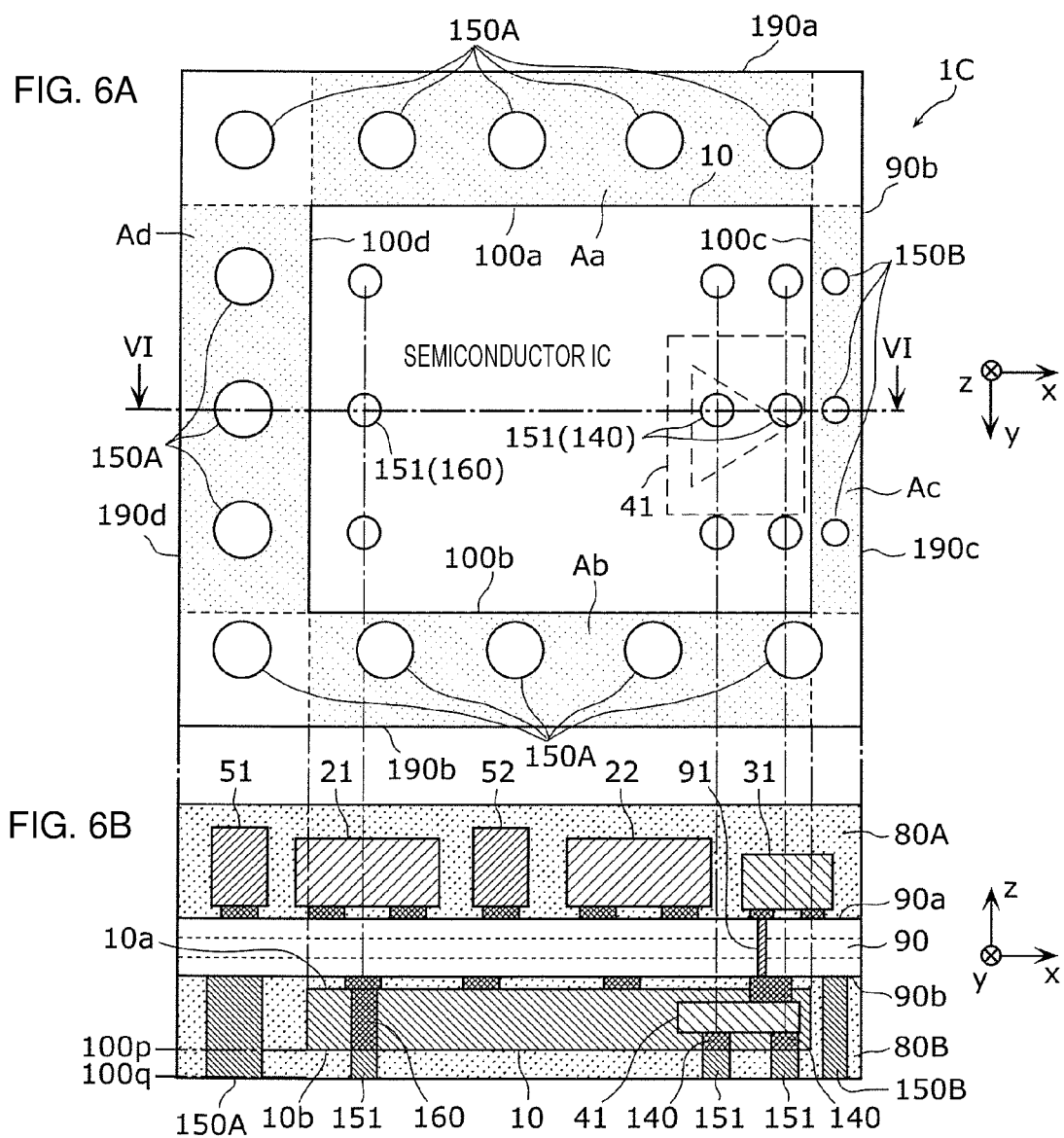

RADIO-FREQUENCY MODULE AND COMMUNICATION DEVICE

CROSS REFERENCE TO RELATED APPLICATIONS

This is a continuation of International Application No. PCT/JP2019/034056 filed on Aug. 30, 2019 which claims priority from Japanese Patent Application No. 2018-189853 filed on Oct. 5, 2018. The contents of these applications are incorporated herein by reference in their entireties.

BACKGROUND OF THE DISCLOSURE

Field of the Disclosure

The present invention relates to a radio-frequency module and a communication device.

Description of the Related Art

Japanese Unexamined Patent Application Publication No. 2007-281160 discloses a (radio-frequency) module embedded with a circuit component. Specifically, the module includes a multilayer circuit board, with surface-mount components mounted on a first main surface of the multilayer circuit board and a semiconductor element mounted on a second main surface of the multilayer circuit board. The module also includes vias and lands, with which the semiconductor element is surrounded when the multilayer circuit board is viewed in plan. Japanese Unexamined Patent Application Publication No. 2007-281160 describes that the module finds use as a radio-frequency module that excels in radio-frequency operation, noise immunity, thermal dissipation, and compactness.

The module disclosed in Japanese Unexamined Patent Application Publication No. 2007-281160, that is, the (radio-frequency) module embedded with a circuit component has a limited degree of flexibility in the placement of the semiconductor element (semiconductor IC) on the second main surface. This is due to the vias and the lands with which the semiconductor element (semiconductor IC) is surrounded when the multilayer circuit board is viewed in plan. When the degree of flexibility in the placement of the semiconductor element is limited, it may be difficult to optimize (minimize the length of) wiring connecting the semiconductor element to the surface-mount components on the first main surface, and radio-frequency propagation characteristics can degrade accordingly. The vias of the same diameter and the lands are distributed along every outer side of the semiconductor element (semiconductor IC), thus taking up a large amount of space and becoming a hindrance to reducing the size of the multilayer circuit board. The degree of flexibility in the placement of the (radio-frequency) module on an external board (motherboard) may be limited accordingly.

The module disclosed in Japanese Unexamined Patent Application Publication No. 2007-281160, that is, the (radio-frequency) module embedded with the semiconductor element (semiconductor IC) surrounded with the vias of the same diameter and with the lands thus guarantees a certain level of electrical performance (e.g., radio-frequency operation and noise immunity) and a certain level of mechanical performance (e.g., mounting strength); however, the design flexibility may not be ensured in terms of the placement of the semiconductor element (semiconductor IC) and may be limited due to the size of the radio-frequency module.

BRIEF SUMMARY OF THE DISCLOSURE

The present invention therefore has been made to solve the problems described above, and it is an object of the present invention to provide a radio-frequency module and a communication device that offer greater design flexibility without degradation in electrical and mechanical performance.

A radio-frequency module according to an aspect of the present invention includes a module substrate, a semiconductor integrated circuit, first connection electrodes, and second connection electrodes. The module substrate has a first main surface and a second main surface. The semiconductor integrated circuit has a third main surface and a fourth main surface and is mounted on the first main surface with the third main surface being located between the module substrate and the fourth main surface. The semiconductor IC processes radio-frequency signals. The first connection electrodes extend perpendicularly to the first main surface from the first main surface to at least a first imaginary plane in which the fourth main surface lies. The second connection electrodes extend perpendicularly to the first main surface from the first main surface to at least the first imaginary plane. The area of a cross section of each of the second connection electrodes is smaller than the area of a cross section of each of the first connection electrodes. The cross sections are parallel to the first main surface. When the module substrate is viewed in plan, the semiconductor IC has a periphery including a first side, a second side, a third side, and a fourth side. The first and second sides are in parallel. The third and fourth sides are in parallel and are orthogonal to the first and second sides. Some of the first connection electrodes are disposed in a first region on the module substrate. The first region is located between the first side and a side that is one of sides constituting a periphery of the module substrate and that faces the first side. Some of the first connection electrodes are disposed in a second region on the module substrate. The second region is located between the second side and a side that is one of the sides constituting the periphery of the module substrate and that faces the second side. Some of the second connection electrodes are disposed in a third region on the module substrate. The third region is located between the third side and a side that is one of the sides constituting the periphery of the module substrate and that faces the third side. None of the first connection electrodes is disposed in the third region.

Other features, elements, characteristics and advantages of the present invention will become more apparent from the following detailed description of preferred embodiments of the present invention with reference to the attached drawings.

Figure 3A:
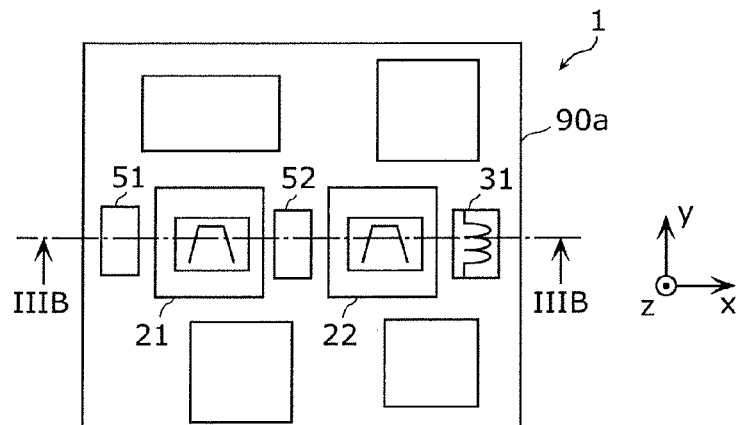
Figure 3B:
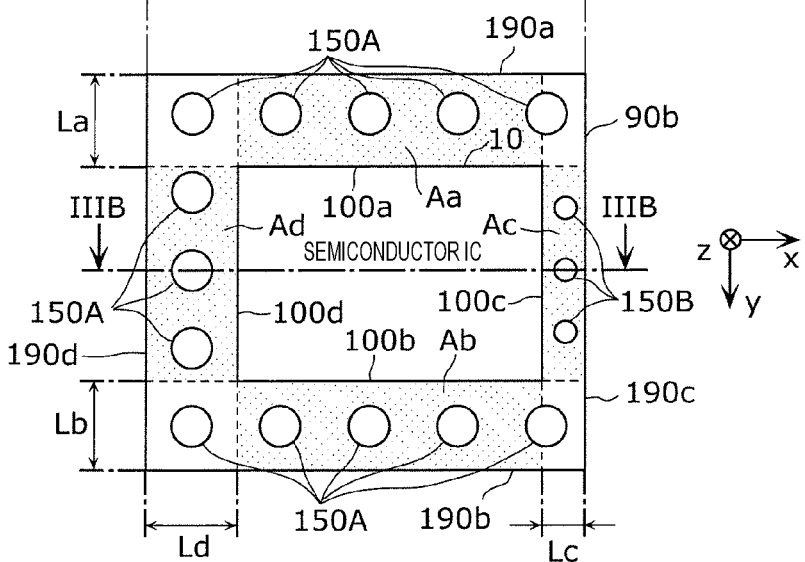
Figure 3C:
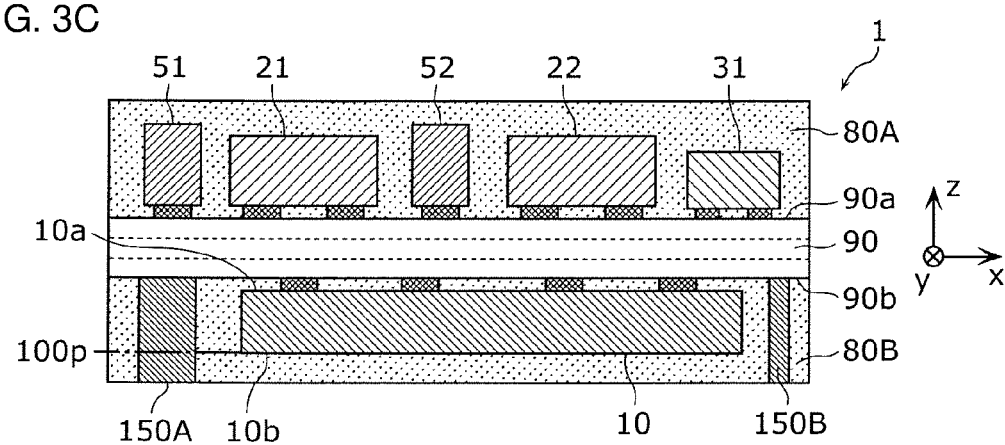
Figure 4:
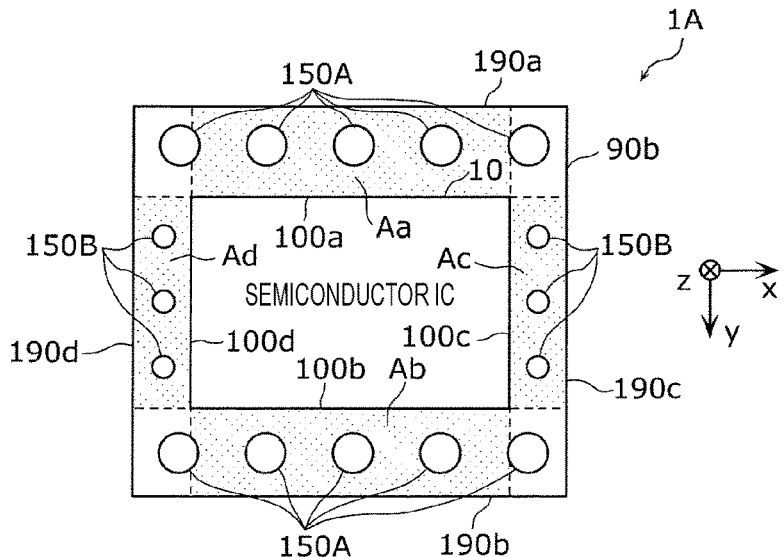
Figure 5A:
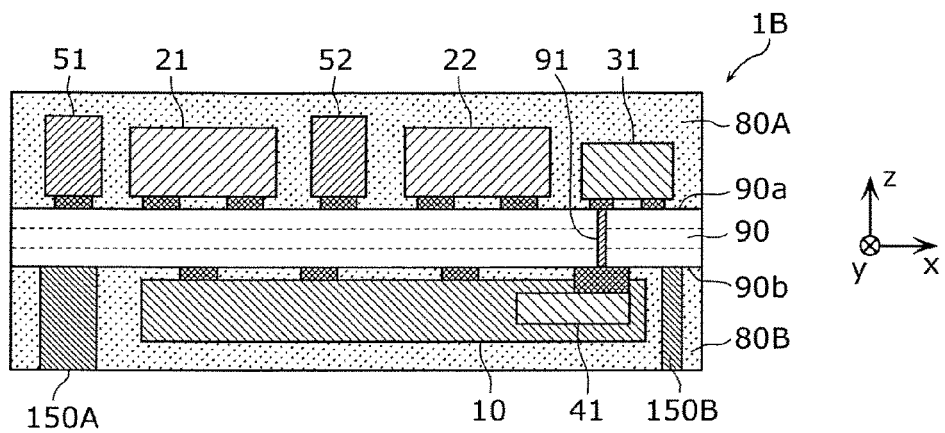
Figure 5B:
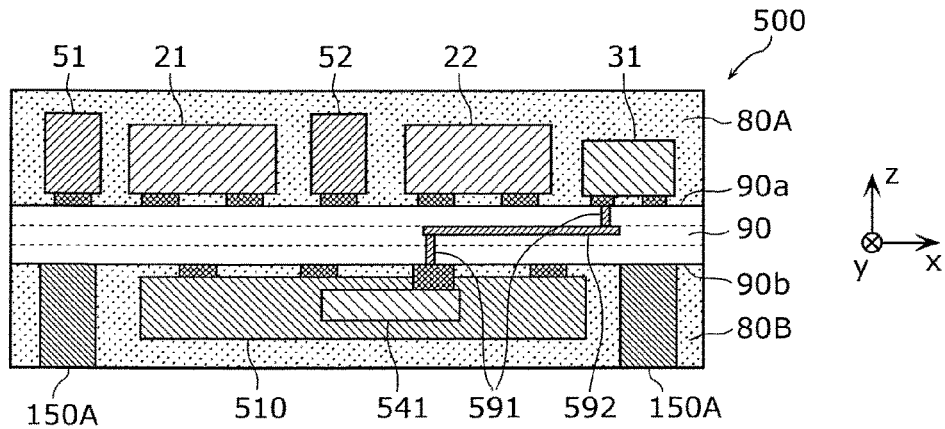
Figure 5C:
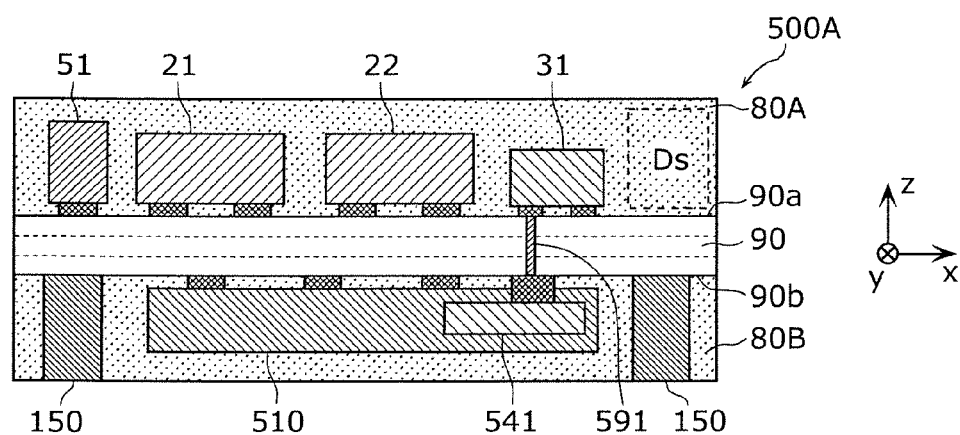
Figure 5D:
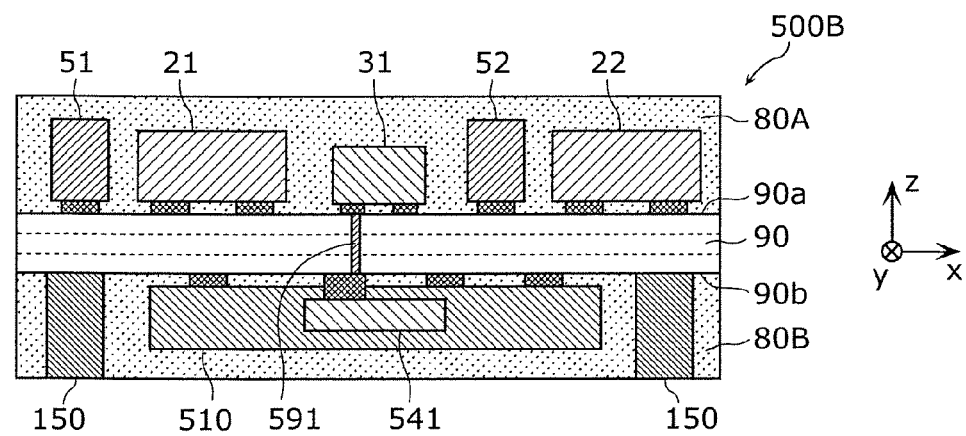
Figure 7A:
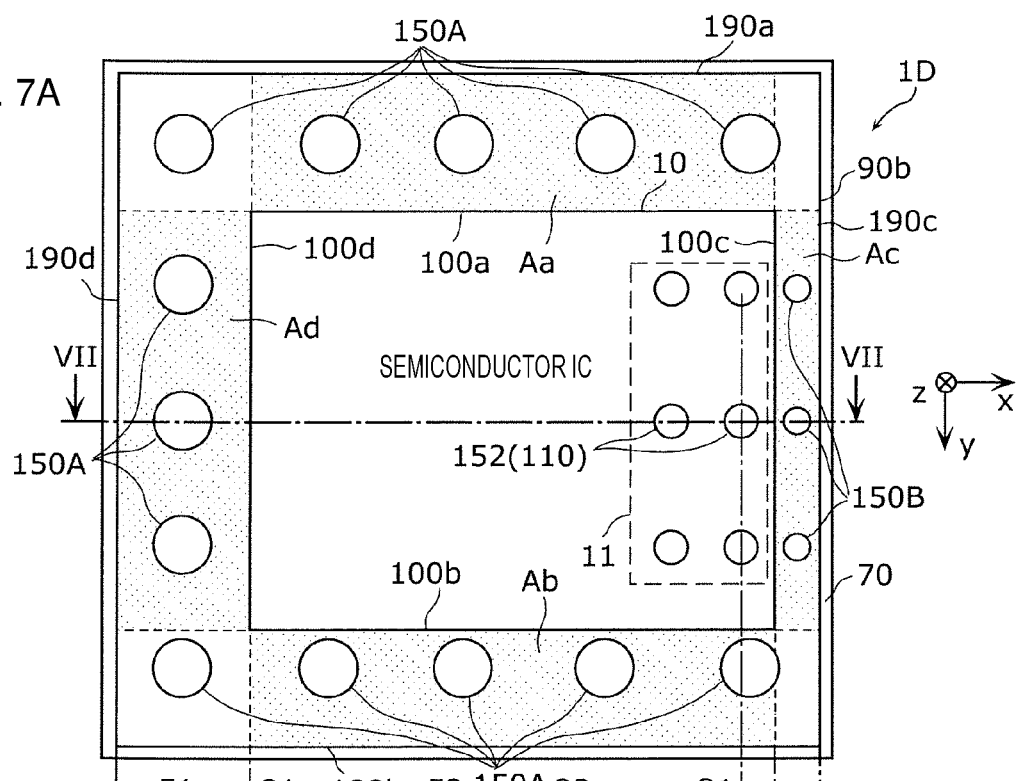
Figure 7B:
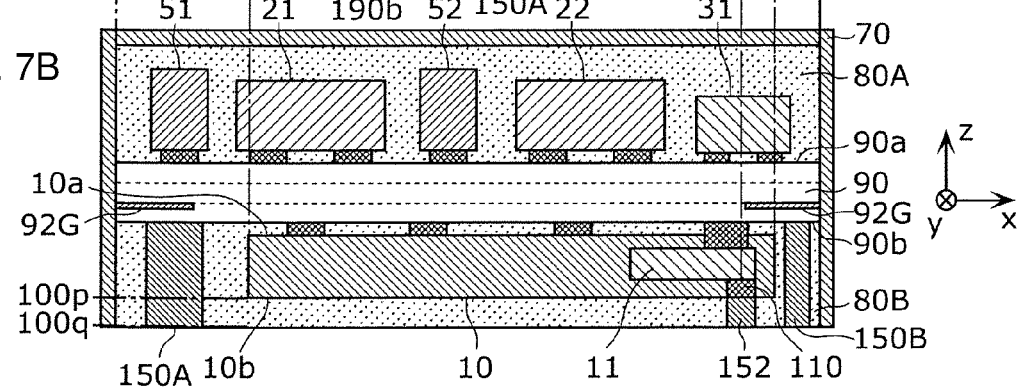

Each of FIGS. 3A and 3B schematically illustrates the planar configuration of a radio-frequency module according to Embodiment 1;

FIG. 3C schematically illustrates the sectional configuration of the radio-frequency module according to Embodiment 1;

FIG. 4 schematically illustrates the planar configuration of a radio-frequency module according to a modification of Embodiment 1;

FIG. 5A schematically illustrates the sectional configuration of a radio-frequency module according to Embodiment 2;

FIG. 5B schematically illustrates the sectional configuration of a radio-frequency module according to Comparative Example 1;

FIG. 5C schematically illustrates the sectional configuration of a radio-frequency module according to Comparative Example 2;

FIG. 5D schematically illustrates the sectional configuration of a radio-frequency module according to Comparative Example 3;

FIGS. 6A and 6B schematically illustrate the planar configuration and the sectional configuration of a radio-frequency module according to Embodiment 3; and FIGS. 7A and 7B schematically illustrate the planar configuration and the sectional configuration of a radio-frequency module according to a modification of Embodiment 3.

DETAILED DESCRIPTION OF THE DISCLOSURE

Hereinafter, the present invention will be described in detail by way of embodiments with reference to the accompanying drawings. The following embodiments are general or specific examples. Details such as values, shapes, materials, constituent components, and arrangements and connection patterns of the constituent components in the following embodiments are provided merely as examples and should not be construed as limiting the present invention. Of the constituent components in the following embodiments, those not mentioned in independent claims are described as optional constituent components. The sizes and the relative proportions of the constituent components illustrated in the drawings are not necessarily to scale.

Embodiment 1

1.1 Circuit Configuration of Communication Device and Radio-Frequency Module

Figure 1:
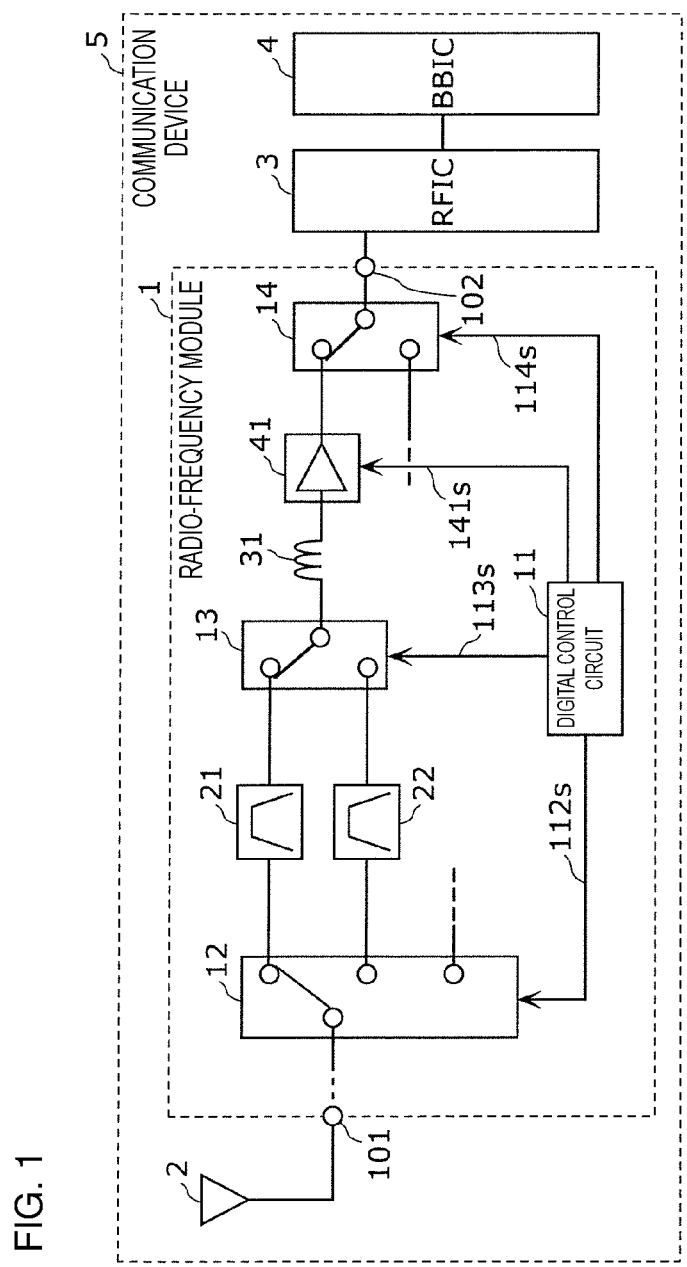
FIG. 1 is a circuit block diagram illustrating a circuit configuration of a communication device according to Embodiment 1.

FIG. 1 is a circuit block diagram illustrating a circuit configuration of a communication device 5 according to Embodiment 1. As illustrated in FIG. 1, the communication device 5 includes a radio-frequency module 1, an antenna element 2, a radio-frequency integrated circuit (RFIC) 3, and a baseband integrated circuit (BBIC) 4. The radio-frequency module 1 is disposed in, for example, a front-end portion of a mobile phone having multi-mode and multi-band features.

The RFIC 3 is an RF signal processing circuit that processes radio-frequency signals transmitted or received via the antenna element 2. Specifically, the RFIC 3 performs signal processing such as down-conversion on radio-frequency signals inputted through an output terminal 102 of the radio-frequency module 1, and outputs the resultant reception signals to the BBIC 4.

The BBIC 4 is a circuit that performs signal processing using intermediate frequency bands lower than the frequency bands of radio-frequency signals propagating through the radio-frequency module 1. The signals processed by the BBIC 4 are used, for example, as image signals for displaying an image or as audio signals for a telephone conversation through a speaker.

The antenna element 2 is connected to a common terminal 101 of the radio-frequency module 1 to enable the radio-frequency module 1 to receive radio-frequency signals from the outside.

The antenna element 2 and the BBIC 4 in the communication device 5 according to the present embodiment are optional.

The following describes, in detail, the configuration of the radio-frequency module 1.

The radio-frequency module 1 includes a digital control circuit 11, a switch 12, a switch 13, a switch 14, an inductor 31, a low-noise amplifier 41, a filter 21, and a filter 22.

The switches 12, 13, and 14 enable switching between propagation paths for radio-frequency signals inputted to the radio-frequency module 1.

More specifically, the switch 12 includes, for example, a common terminal and selection terminals to switch among the state in which the antenna element 2 is connected to the filter 21, the state in which the antenna element 2 is connected to the filter 22, and the state in which the antenna element 2 is connected to another filter.

The switch 13 includes, for example, a common terminal and two selection terminals to switch between the state in which the inductor 31 is connected to the filter 21 and the state in which the inductor 31 is connected to the filter 22.

The switch 14 includes, for example, a common terminal and two selection terminals to switch between the state in which the RFIC 3 is connected to the low-noise amplifier 41 and the state in which the RFIC 3 is connected to another low-noise amplifier.

The filter 21 is, for example, a band-pass filter whose pass band is a first frequency band. The filter 22 is, for example, a band-pass filter whose pass band is a second frequency band.

The filters 21 and 22 may be surface acoustic wave filters, acoustic wave filters using bulk acoustic waves (BAWs), LC resonant filters, or dielectric filters but are not limited thereto.

The inductor 31 is a matching element for matching the output impedance of the filters 21 and 22 to the input impedance of the low-noise amplifier 41. The inductor 31 above is a matching element in series with a path forming a connection between the switch 13 and the low-noise amplifier 41. Alternatively, the inductor 31 may be connected between a node on the path and the ground. In some embodiments, the matching element includes one or more inductors and one or more capacitors. The inductor 31 is typically a chip inductor mounted on a module substrate 90. In some embodiments, however, the inductor 31 may be planar coils in the module substrate 90.

The low-noise amplifier 41 amplifies radio-frequency signals lying in the first frequency band and coming out of the filter 21 or radio-frequency signals lying in the second frequency band and coming out of the filter 22.

The digital control circuit 11 is incorporated in a semiconductor integrated circuit (IC) 10.

Figure 2:
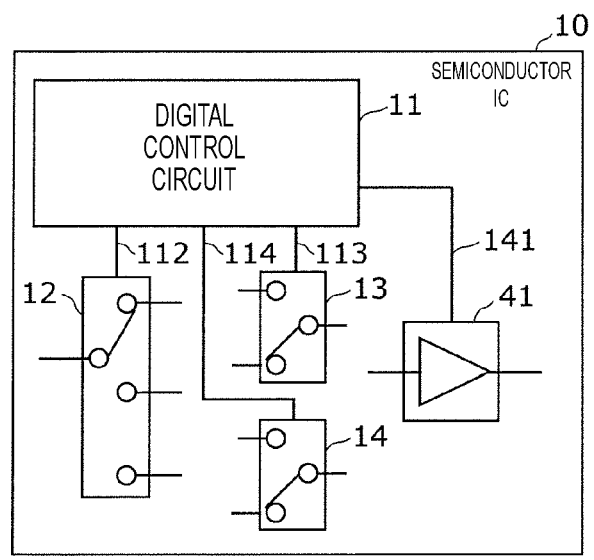
FIG. 2 schematically illustrates an arrangement of circuit elements incorporated in a semiconductor integrated circuit (IC) according to Embodiment 1 and viewed in plan.

FIG. 2 schematically illustrates an arrangement of circuit elements incorporated in the semiconductor IC 10 according to Embodiment 1 and viewed in plan. Referring to FIG. 2, the semiconductor IC 10 includes the digital control circuit 11, the switches 12, 13, and 14, and the low-noise amplifier 41. The digital control circuit 11 and radio-frequency circuit elements such as the switches 12 to 14 and the low-noise amplifier 41 are on the same IC substrate.

The semiconductor IC 10 is, for example, a complementary metal oxide semiconductor (CMOS). The semiconductor IC 10 may thus be produced inexpensively. The semiconductor IC 10 may be formed from GaAs. Such a semiconductor IC enables the output of radio-frequency signals with excellent amplification performance and excellent noise performance.

The circuit elements incorporated in the semiconductor IC 10 are individually connected to the digital control circuit 11 through digital control lines. The switch 12 is connected to the digital control circuit 11 through a control line 112. The switch 13 is connected to the digital control circuit 11 through a control line 113. The switch 14 is connected to the digital control circuit 11 through a control line 114. The low-noise amplifier 41 is connected to the digital control circuit 11 through a control line 141.

Through the control line 112, the digital control circuit 11 supplies the switch 12 with a digital control signal 112s for switching between electrical continuity and non-continuity in the switch 12. Through the control line 113, the digital control circuit 11 supplies the switch 13 with a digital control signal 113s for switching between electrical continuity and non-continuity in the switch 13. Through the control line 114, the digital control circuit 11 supplies the switch 14 with a digital control signal 114s for switching between electrical continuity and non-continuity in the switch 14. Through the control line 141, the digital control circuit 11 supplies the low-noise amplifier 41 with a digital control signal 141s for adjusting the amplification ratio of the low-noise amplifier 41.

That is, the radio-frequency module 1 controls the switches 12 to 14 and the low-noise amplifier 41 by using the digital control circuit 11, and radio-frequency signals received via the antenna element 2 propagate through appropriate signal paths and are transmitted to the RFIC 3 and BBIC 4 accordingly.

The radio-frequency module 1 in the present embodiment is exemplified by a radio-frequency module including a reception/demultiplexing circuit. In some embodiments, the radio-frequency module according to the present invention is a transmission/multiplexing circuit or a demultiplexing/multiplexing circuit capable of transmitting and receiving signals. The number of frequency bands (signal paths) is not limited to a particular value. It is not required that one signal path be selected by the radio-frequency module 1. The radio-frequency module 1 is applicable to a system capable of receiving radio-frequency signals in two or more frequency bands at the same time. In such a case, the switches 12 to 14 may each be capable of connecting one common terminal to two or more selection terminals at the same time.

Of the circuit elements (circuit components) constituting the radio-frequency module 1 according to Embodiment 1, at least the semiconductor IC 10 is to be included in the radio-frequency module according to the present embodiment. It is required that the semiconductor IC 10 include the digital control circuit 11. The low-noise amplifier 41 and the switches 12 to 14 are optional. The low-noise amplifier 41 and the switches 12 to 14 may be discrete components of the radio-frequency module 1 that are disposed outside the semiconductor IC 10.

1.2 Layout of Circuit Elements of Radio-Frequency Module

Each of FIGS. 3A and 3B schematically illustrates the planar configuration of the radio-frequency module 1 according to Embodiment 1. FIG. 3C schematically illustrates the sectional configuration of the radio-frequency module 1 according to Embodiment 1, or more specifically, is a sectional view taken along line IIIB-IIIB in each of FIGS. 3A and 3B. FIG. 3A illustrates the layout of circuit elements on the module substrate 90 having a main surface 90a and a main surface 90b, with the main surface 90a being viewed from the positive side in the z-axis direction. FIG. 3B illustrates the layout of the circuit elements on the module substrate 90, with the main surface 90b being viewed from the negative side in the y-axis direction.

As illustrated in FIGS. 3A, 3B and 3C, the radio-frequency module 1 according to the present embodiment includes the module substrate 90, the semiconductor IC 10, columnar electrodes 150A, columnar electrodes 150B, the filters 21 and 22, the inductor 31, a circuit element 51, a circuit element 52, a resin member 80A, and a resin member 80B.

The module substrate 90 has the main surface 90a (a second main surface) and the main surface 90b (a first main surface). The semiconductor IC 10, the filters 21 and 22, the inductor 31, and the circuit elements 51 and 52 are mounted on the module substrate 90. The module substrate 90 may be a low-temperature co-fired ceramic (LTCC) substrate including a plurality of dielectric layers stacked on top of each other or may be a printed circuit board.

The filters 21 and 22, the inductor 31, and the circuit elements 51 and 52 are mounted on the main surface 90a. The filters 21 and 22, the inductor 31, and the circuit elements 51 and 52 are electrically and mechanically connected to the module substrate 90 through land electrodes and bumps or solder on the main surface 90a of the module substrate 90.

The circuit elements 51 and 52, which are not shown in FIG. 1 illustrating the circuit configuration of the radio-frequency module 1, are included in the radio-frequency module 1 and may each be a filter, a switch, an inductor, or a capacitor.

Although both the main surfaces 90a and 90b of the module substrate 90 may be populated with circuit elements, it is not required that the filters 21 and 22, the inductor 31, the circuit elements 51 and 52, and other circuit elements be mounted on the main surface 90a.

The semiconductor IC 10 has a main surface 10a (a third main surface) and a main surface 10b (a fourth main surface). When viewed in plan, the main surfaces 10a and 10b each has a substantially rectangular outer shape. The semiconductor IC 10 is mounted on the main surface 90b in such a manner that the main surface 10a of the semiconductor IC 10 faces the main surface 90b of the module substrate 90. The semiconductor IC 10 is electrically and mechanically connected to the module substrate 90 through land electrodes and bumps or solder on the main surface 90b of the module substrate 90.

Corner portions of the semiconductor IC 10 having a substantially rectangular shape may be chambered or rounded. The semiconductor IC 10 may have a cutout in an outer portion thereof.

The main surfaces 90a and 90b, planar wiring patterns in the module substrate 90, and via conductors in the module substrate 90 provide electrical connection between the circuit elements on the main surface 90a, electrical connection between the elements incorporated in the semiconductor IC 10 mounted on the main surface 90b, and electrical connection between the semiconductor IC 10 and each element mounted on the main surface 90a.

The planner wiring patterns are conductive films parallel to the main surfaces 90a and 90b of the module substrate 90.

The via conductors are columnar conductors extending perpendicularly to the main surfaces 90a and 90b of the module substrate 90.

The resin member 80A is disposed on the main surface 90a of the module substrate 90. The resin member 80A covers the main surface 90a and at least part of the circuit elements on the main surface 90a so as to ensure reliability of the circuit elements in terms of mechanical strength and moisture resistance. The resin member 80B is disposed on the main surface 90b of the module substrate 90. The resin member 80B covers the semiconductor IC 10 and the main surface 90b so as to ensure reliability of the semiconductor IC 10 in terms of mechanical strength and moisture resistance. It is not required that the main surface 90b and the semiconductor IC 10 be entirely covered with the resin member 80B. The main surface 90b and the semiconductor IC 10 may be partially covered with the resin member 80B. For example, the resin member 80B may be provided between the semiconductor IC 10 and the main surface 90b only. The resin members 80A and 80B in the radio-frequency module according to the present invention are optional.

When the module substrate 90 is viewed in section as in FIG. 3C, the columnar electrodes 150A, which are herein also referred to as first connection electrodes, extend perpendicularly to the main surface 90b (i.e., in the z-axis direction) from the main surface 90b to at least an imaginary plane 100p (a first imaginary plane). The main surface 10b lies in the imaginary plane 100p. When the module substrate 90 is viewed in section as in FIG. 3C, the columnar electrodes 150B, which are herein also referred to as second connection electrodes, extend perpendicularly to the main surface 90b (i.e., in the z-axis direction) from the main surface 90b to at least the imaginary plane 100p. The area of a cross section of each of the columnar electrodes 150B is smaller than the area of a cross section of each of the columnar electrodes 150A. The cross sections are parallel to the main surface 90b. In the present embodiment, the columnar electrodes 150A and 150B each have a cylindrical shape, and the diameter of a cross section of each of the columnar electrodes 150B is smaller than the diameter of a cross section of each of the columnar electrodes 150A. The cross sections are parallel to the main surface 90b.

The columnar electrodes 150A and 150B in the present embodiment extend beyond the imaginary plane 100p, that is, extend perpendicularly to the main surface 90b (i.e., in the z-axis direction) from the main surface 90b to a surface of the resin member 80B. The columnar electrodes 150A and 150B each have a first end located on the main surface 90b and electrically connected to a land electrode, a planar wiring pattern, or a via conductor provided in the module substrate 90. The columnar electrodes 150A and 150B each have a second end exposed at the surface of the resin member 80B in a manner so as to be electrically connectable to electrodes of an external board (motherboard) on which the radio-frequency module 1 is to be mounted. The columnar electrodes 150A and 150B may each be an electrode set to the ground potential (GND) of the radio-frequency module 1 or may each be an electrode such as the common terminal 101 (see FIG. 1) that allows the passage of radio-frequency signals (hot signals) propagating through the radio-frequency module 1.

In the present embodiment and in Embodiment 2, which will be described later, the columnar electrodes 150A and 150B may each have a cylindrical shape or may each be in the form of, for example, a prism. The columnar electrodes 150A and 150B may be solder balls or connection electrodes such bump electrodes. In such a case, the columnar electrodes 150A and 150B may each have a spherical surface.

The cross sections of the columnar electrodes 150A and 150B (i.e., their cross sections parallel to the main surface 90b) may be eccentric, or more specifically, elliptic, rectangular, or polygonal.

As illustrated in FIG. 3B, the periphery of the semiconductor IC 10 includes a side 100a (a first side), a side 100b (a second side), a side 100c (a third side), and a side 100d (a fourth side). The sides 100a and 100b are in parallel. The sides 100c and 100d are in parallel and are orthogonal to the sides 100a and 100b.

The periphery of the module substrate 90 includes a side 190a, a side 190b, a side 190c, and a side 190d. The sides 190a and 190b are in parallel. The sides 190c and 190d are in parallel and are orthogonal to the sides 190a and 190b.

The expressions "are in parallel" herein does not necessarily mean that two sides form an angle of zero degrees in a strict sense. The angle formed by the two sides concerned may be within a range of ±15 degrees.

The columnar electrodes 150A are distributed over a region Aa (a first region), a region Ab (a second region), and a region Ad on the module substrate 90. The region Aa is located between the side 100a and the side 190a facing the side 100a. The region Ab is located between the side 100b and the side 190b facing the side 100b. The region Ad is located between the side 100d and the side 190d facing the side 100d. The columnar electrodes 150B are disposed in a region Ac (a third region) on the module substrate 90. The region Ac is located between the side 100c and the side 190c facing the side 100c. None of the columnar electrodes 150A is disposed in the region Ac.

Each of the sides of the semiconductor IC 10 faces the corresponding one of the sides of the module substrate 90 with none of the other sides of the semiconductor IC 10 and none of the other sides of the module substrate 90 being located between the two sides concerned.

That is, in place of the columnar electrodes 150A, the columnar electrodes 150B, each of which has a cross-sectional area smaller than the cross-sectional area of each of the columnar electrodes 150A, are disposed in the region Ac on the module substrate 90 viewed in plan. The degree of flexibility in the placement of the semiconductor IC 10 is higher in the radio-frequency module 1 than in a radio-frequency module including the columnar electrodes 150A distributed over the regions Aa to Ad. The layout above also enables a reduction in the area of the region Ac. The higher degree of flexibility in the placement of the semiconductor IC 10 and/or the reduction in the size of the module substrate 90 enables the radio-frequency module 1 to achieve area savings, thus providing a higher degree of flexibility in the design of the radio-frequency module 1. The semiconductor IC 10 is surrounded with four regions (i.e., the regions Aa to Ad), each of which has a number of columnar electrodes 150A or a number of columnar electrodes 150B disposed therein. This layout helps achieve secure mounting of the radio-frequency module 1 on the external board while ensuring enhanced grounding and proper extraction of electrical signals processed by the semiconductor IC 10 and the individual circuit elements.

When the module substrate 90 is viewed in plan, Lc may be less than La and may also be less than Lb, where Lc denotes the distance between the side 100c and the side 190c being one of the sides of the module substrate 90 and defining the region Ac, La denotes the distance between the side 100a and the side 190a, and Lb denotes the distance between the side 100b and the side 190b.

The semiconductor IC 10 is surrounded with four regions (i.e., the regions Aa to Ad), each of which has a number of columnar electrodes 150A or a number of columnar electrodes 150B disposed therein. This layout ensures enhanced grounding, proper extraction of electrical signals processed by the semiconductor IC 10 and the individual circuit elements, and secure mounting of the radio-frequency module 1 on the external board. Furthermore, the reduction in the area of the region Ac on the module substrate 90 enables the radio-frequency module 1 to achieve area savings.

FIG. 4 schematically illustrates the planar configuration of a radio-frequency module 1A according to a modification of Embodiment 1. The difference between the radio-frequency module 1A in FIG. 4 and the radio-frequency module 1 according to Embodiment 1 is only in the layout of the columnar electrodes 150A and 150B. Configurations common to the radio-frequency module 1A according to this modification and the radio-frequency module 1 according to Embodiment 1 will be omitted from the following description, which will be given while focusing on distinctive features of the radio-frequency module 1A.

The columnar electrodes 150A, each of which has a cross-sectional area larger than the cross-sectional area of each of the columnar electrodes 150B, are distributed over the region Aa (the first region) and the region Ab (the second region) on the module substrate 90. The region Aa is located between the side 100a and the side 190a facing the side 100a. The region Ab is located between the side 100b and the side 190b facing the side 100b. The columnar electrodes 150B, each of which has a cross-sectional area smaller than the cross-sectional area of each of the columnar electrodes 150A, are distributed over the region Ac (the third region) and the region Ad (a fourth region) on the module substrate 90. The region Ac is located between the side 100c and the side 190c facing the side 100c. The region Ad is located between the side 100d and the side 190d facing the side 100d. None of the columnar electrodes 150A is disposed in the region Ac or Ad.

That is, in place of the columnar electrodes 150A, the columnar electrodes 150B, each of which has a cross-sectional area smaller than the cross-sectional area of each of the columnar electrodes 150A, are distributed over the opposite regions Ac and Ad on the module substrate 90 viewed in plan. The degree of flexibility in the placement of the semiconductor IC 10 is higher in the radio-frequency module 1A than in a radio-frequency module including the columnar electrodes 150A distributed over the regions Aa to Ad. The layout above also enables a reduction in the area of the regions Ac and Ad, thus providing additional degrees of flexibility in the design of the radio-frequency module 1A. The semiconductor IC 10 is surrounded with four regions (i.e., the regions Aa to Ad), each of which has a number of columnar electrodes 150A or a number of columnar electrodes 150B disposed therein. This layout enables mounting of the radio-frequency module 1A on the external board while ensuring enhanced grounding and proper extraction of electrical signals processed by the semiconductor IC 10 and the individual circuit elements.

1.3 Effects

The radio-frequency module 1 according to the present embodiment includes the module substrate 90, the semiconductor IC 10, the columnar electrodes 150A, and the columnar electrodes 150B. The module substrate 90 has the main surfaces 90a and 90b. The semiconductor IC 10 has the main surfaces 10a and 10b and is mounted on the main surface 90b with the main surface 10a being located between the module substrate 90 and the main surface 10b. The semiconductor IC 10 processes radio-frequency signals. The columnar electrodes 150A extend perpendicularly to the main surface 90b from the main surface 90b to at least the imaginary plane 100p. The main surface 10b lies in the imaginary plane 100p. The columnar electrodes 150B extend perpendicularly to the main surface 90b from the main surface 90b to at least the imaginary plane 100p. The area of a cross section of each of the columnar electrodes 150B is smaller than the area of a cross section of each of the columnar electrodes 150A. The cross sections are parallel to the main surface 90b. When the module substrate 90 is viewed in plan, the periphery of the semiconductor IC 10 includes the sides 100a, 100b, 100c, and 100d. The sides 100a and 100b are in parallel. The sides 100c and 100d are in parallel and are orthogonal to the sides 100a and 100b. Some of the columnar electrodes 150A are disposed in the region Aa on the module substrate 90 between the side 100a and the side 190a facing the side 100a. Some of the columnar electrodes 150A are disposed in the region Ab on the module substrate 90 between the side 100b and the side 190b facing the side 100b. Some of the columnar electrodes 150B are disposed in the region Ac on the module substrate 90 between the side 100c and the side 190c facing the side 100c. None of the columnar electrodes 150A is disposed in the region Ac.

That is, in place of the columnar electrodes 150A, the columnar electrodes 150B, each of which has a cross-sectional area smaller than the cross-sectional area of each of the columnar electrodes 150A, are disposed in the region Ac on the module substrate 90 viewed in plan. The degree of flexibility in the placement of the semiconductor IC 10 is higher in the radio-frequency module 1 than in a radio-frequency module including the columnar electrodes 150A distributed over the regions Aa to Ad. The layout above also enables a reduction in the area of the region Ac. The higher degree of flexibility in the placement of the semiconductor IC 10 and/or the reduction in the size of the module substrate 90 enables the radio-frequency module 1 to achieve area savings, thus providing a higher degree of flexibility in the design of the radio-frequency module 1. The semiconductor IC 10 is surrounded with four regions (i.e., the regions Aa to Ad), each of which has a number of columnar electrodes 150A or a number of columnar electrodes 150B disposed therein. This layout enables mounting of the radio-frequency module 1 on the external board while ensuring enhanced grounding and proper extraction of electrical signals processed by the semiconductor IC 10 and the individual circuit elements.

The radio-frequency module 1 that offers greater design flexibility without degradation in electrical and mechanical performance and the communication device 5 including the radio-frequency module 1 are provided accordingly.

Embodiment 2

The following describes the layout of an amplifier circuit incorporated in the semiconductor IC 10 and a matching circuit element connected to the amplifier circuit.

FIG. 5A schematically illustrates the sectional configuration of a radio-frequency module 1B according to Embodiment 2. The radio-frequency module 1B according to the present embodiment has the planar configuration illustrated in each of FIGS. 3A and 3B. FIG. 5A is a sectional view of the radio-frequency module 1B taken along line IIIB-IIIB in each of FIGS. 3A and 3B.

As illustrated in FIG. 5A, the radio-frequency module 1B according to the present embodiment includes a module substrate 90, a semiconductor IC 10, columnar electrodes 150A, columnar electrodes 150B, a filter 21, a filter 22, an inductor 31, a circuit element 51, a circuit element 52, and a resin member 80A, and a resin member 80B. Unlike the radio-frequency module 1 according to Embodiment 1, the radio-frequency module 1B in FIG. 5A reveals the layout of elements in the semiconductor IC 10 and the connection between the semiconductor IC 10 and the inductor 31. Configurations common to the radio-frequency module 1B according to the present embodiment and the radio-frequency module 1 according to Embodiment 1 will not be fully dealt with in the following description, which will be given while focusing on distinctive features of the radio-frequency module 1B.

The area of a cross section of each of the columnar electrodes 150B is smaller than the area of a cross section of each of the columnar electrodes 150A. The cross sections are parallel to a main surface 90b of the module substrate 90. In the present embodiment, the columnar electrodes 150A and 150B each have a cylindrical shape, and the diameter of a cross section of each of the columnar electrodes 150B is smaller than the diameter of a cross section of each of the columnar electrodes 150A. The cross sections are parallel to the main surface 90b.

The inductor 31 is disposed on a main surface 90a of the module substrate 90 and is herein also referred to as a first component. The inductor 31 is connected to the semiconductor IC 10 through a via conductor 91, which is disposed in the module substrate 90 and extends perpendicularly to the main surfaces 90a and 90b (i.e., in the z-axis direction).

This configuration enables a shortening of wiring connecting the inductor 31 to the semiconductor IC 10. The wiring (the via conductor 91) is of low resistance with small parasitic capacitance, thus enabling the radio-frequency module 1B to achieve low-loss transmission and to offer added performance.

In the present embodiment, the first component connected to the semiconductor IC 10 through the via conductor 91 is not limited to the inductor 31 and may be the filters 21 and 22 mounted on the main surface 90a or the circuit elements 51 and 52 mounted on the main surface 90a.

When the module substrate 90 is viewed in plan, the via conductor 91 may be closer to a side 100c than to sides 100a, 100b, and 100d of the semiconductor IC 10.

Owing to this layout, the via conductor 91 is not adjacent to the columnar electrodes 150A, each of which has a cross-sectional area larger than the cross-sectional area of each of the columnar electrodes 150B, and the via conductor 91 is in a region close to an end portion of the semiconductor IC 10 and is thus less likely to be adjacent to the wiring in the module substrate 90. The parasitic capacitance arising from the via conductor 91 and the columnar electrodes 150A, and the parasitic capacitance arising from the via conductor 91 and the wiring may be reduced accordingly. When the inductor 31 connected to the semiconductor IC 10 through the via conductor 91 is close to the side 100c, there is an overlap between the inductor 31 and the semiconductor IC 10 on the module substrate 90 viewed in plan. This layout enables area savings with a shortening of wiring connecting the inductor 31 to the semiconductor IC 10.

As illustrated in FIG. 5A, a low-noise amplifier 41 is incorporated in the semiconductor IC 10 of the radio-frequency module 1B according to the present embodiment. The inductor 31 and the low-noise amplifier 41 are connected to each other through the via conductor 91.

FIG. 5B schematically illustrates the sectional configuration of a radio-frequency module 500 according to Comparative Example 1. As illustrated in FIG. 5B, the radio-frequency module 500 according to Comparative Example 1 includes a module substrate 90, a semiconductor IC 510, columnar electrodes 150A, a filter 21, a filter 22, an inductor 31, a circuit element 51, a circuit element 52, a resin member 80A, and a resin member 80B. The radio-frequency module 500 according to Comparative Example 1 differs from the radio-frequency module 1B according to Embodiment 2 in two ways; that is, the layout of a low-noise amplifier 541 in the semiconductor IC 510 is different from the layout of the low-noise amplifier 41 in the semiconductor IC 10, and some of the columnar electrodes 150A are disposed in the region Ac on the module substrate 90. Configurations common to the radio-frequency module 500 according to Comparative Example 1 and the radio-frequency module 1B according to Embodiment 2 will not be fully dealt with in the following description, which will be given while focusing on distinctive features of the radio-frequency module 500.

The semiconductor IC 510 includes the low-noise amplifier 541. The inductor 31 and the low-noise amplifier 541 are connected to each other through via conductors 591 and a planar wiring pattern 592.

The columnar electrodes 150A are distributed over regions Aa, Ab, Ac, and Ad, each of which is defined between each of the four sides constituting the periphery of the semiconductor IC 510 and the corresponding one of the four sides of the module substrate 90.

When the module substrate 90 is viewed in plan, some of the columnar electrodes 150A are disposed in the region Ac, and the low-noise amplifier 541 is thus not adjacent to sides 100a to 100d of the semiconductor IC 510; that is, the low-noise amplifier 541 is in a region in the middle of the semiconductor IC 510. The inductor 31 is closer to the side 100c than to the sides 100a, 100b, and 100d and is in a region close to an end portion of the module substrate 90.

The radio-frequency module 500 according to Comparative Example 1, in which the inductor 31 is in the region close to the end portion of the module substrate 90, suppresses unwanted magnetic field coupling or unwanted electric field coupling between the inductor 31 and the components mounted on the module substrate 90. However, the radio-frequency module 500 may suffer from a significant propagation loss arising from wiring forming a connection between the inductor 31 and the low-noise amplifier 541, or more specifically, the via conductor 591 and the planar wiring pattern 592 that are of high resistance with large parasitic capacitance.

FIG. 5C schematically illustrates the sectional configuration of a radio-frequency module 500A according to Comparative Example 2. The difference between the radio-frequency module 500A according to Comparative Example 2 and the radio-frequency module 500 according to Comparative Example 1 is in the layout of the low-noise amplifier 541 and the inductor 31.

Unlike the low-noise amplifier 541 and the inductor 31 of the radio-frequency module 500 according to Comparative Example 1, the low-noise amplifier 541 and the inductor 31 of the radio-frequency module 500A according to Comparative Example 2 are connected to each other through the via conductor 591 only. This connection necessitates shifting the position of the inductor 31 toward the center of the main surface 90a, and a dead space Ds is left on a peripheral region of the main surface 90a, that is, on the region that overlaps the columnar electrodes 150A when the main surface 90a is viewed in plan. There is a concern about unwanted coupling between the inductor 31 and any component placed in the dead space Ds.

The dead space Ds in the radio-frequency module 500A according to Comparative Example 2 may thus be a hindrance to area savings, and the radio-frequency signal transmission characteristics of the radio-frequency module 500A can degrade due to unwanted coupling between the inductor 31 and the other components.

FIG. 5D schematically illustrates the sectional configuration of a radio-frequency module 500B according to Comparative Example 3. The low-noise amplifier 541 and the inductor 31 are closer to the center of the main surface 90a in the radio-frequency module 500B according to Comparative Example 3 than in the radio-frequency module 500A according to Comparative Example 2. This layout further increases the probability of the occurrence of unwanted coupling between the inductor 31 and components disposed around the inductor 31.

The radio-frequency signal transmission characteristics of the radio-frequency module 500B according to Comparative Example 3 can degrade due to unwanted coupling between the inductor 31 and the other components.

As a workaround, the low-noise amplifier 41 and the inductor 31 of the radio-frequency module 1B according to the present embodiment are placed in an optimum layout when the module substrate 90 is viewed in plan; that is, the low-noise amplifier 41 and the inductor 31 are closer to the side 100c than to the sides 100a, 100b, and 100d.

Owing to this layout, the low-noise amplifier 41, the inductor 31, and the via conductor 91 are not adjacent to the columnar electrodes 150A, each of which has a cross-sectional area larger than the cross-sectional area of each of the columnar electrodes 150B. The low-noise amplifier 41, the inductor 31, and the via conductor 91 are in a region close to an end portion of the semiconductor IC 10 and is thus less likely to be adjacent to the wiring in the module substrate 90. Consequently, unwanted magnetic field coupling or unwanted electric field coupling between the inductor 31 and other circuit elements or between the inductor 31 and the wiring may be suppressed. This layout enables a shortening of wiring connecting the inductor 31 to the semiconductor IC 10. The wiring (the via conductor 91) is of low resistance with small parasitic capacitance, thus suppressing radio-frequency noise in a stage preceding the low-noise amplifier 41. This layout enables the radio-frequency module 1B to achieve low-loss transmission and to offer added performance.

The embodiment above describes that the low-noise amplifier 41 and the inductor 31 are closer to the side 100c than to the sides 100a, 100b, and 100d when the module substrate 90 is viewed in plan. In some embodiments, however, any power amplifier incorporated in the semiconductor IC 10 and a matching element connected to an output terminal of the power amplifier may be closer to the side 100c than to the sides 100a, 100b, and 100d. In other words, an amplifier circuit and a matching element (a first component) connected to the amplifier circuit may be closer to the side 100c than to the sides 100a, 100b, and 100d.

Embodiment 3

The following describes the configuration of a radio-frequency module that includes third connection electrodes extending perpendicularly to the main surface of the semiconductor IC 10 from the main surface.

FIGS. 6A and 6B schematically illustrate the planar configuration and the sectional configuration of a radio-frequency module 1C according to Embodiment 3. FIG. 6A illustrates the layout of circuit elements on a module substrate 90 having a main surface 90a and a main surface 90b, with the main surface 90b being viewed from the negative side in the z-axis direction. FIG. 6B is a sectional view of the radio-frequency module 1C taken along line VI-VI in FIG. 6A. When the main surface 90a is viewed from the positive side in the z-axis direction, the circuit elements are placed in the layout illustrated in FIG. 3A, and a redundant illustration is eliminated.

As illustrated in FIGS. 6A and 6B, the radio-frequency module 1C according to the present embodiment includes the module substrate 90, a semiconductor IC 10, columnar electrodes 150A, columnar electrodes 150B, via conductors 151, a filter 21, a filter 22, an inductor 31, a circuit element 51, a circuit element 52, a resin member 80A, and a resin member 80B. The radio-frequency module 1C in FIGS. 6A and 6B differs from the radio-frequency module 1B according to Embodiment 2 in that the via conductors 151 are disposed. Configurations common to the radio-frequency module 1C according to the present embodiment and the radio-frequency module 1B according to Embodiment 2 will not be fully dealt with in the following description, which will be given while focusing on distinctive features of the radio-frequency module 1C.

When the module substrate 90 is viewed in section, the columnar electrodes 150A and 150B extend perpendicularly to the main surface 90b (i.e., in the z-axis direction) from the main surface 90b to an imaginary plane 100q (a second imaginary plane). The imaginary plane 100q is farther than an imaginary plane 100p (a first imaginary plane) from the main surface 90b. A surface of the resin member 80B lies in the imaginary plane 100q (the second imaginary plane).

The area of a cross section of each of the columnar electrodes 150B is smaller than the area of a cross section of each of the columnar electrodes 150A. The cross sections are parallel to the main surface 90b. In the present embodiment, the columnar electrodes 150A and 150B each have a cylindrical shape, and the diameter of a cross section of each of the columnar electrodes 150B is smaller than the diameter of a cross section of each of the columnar electrodes 150A. The cross sections are parallel to the main surface 90b.

As illustrated in FIG. 6A, the columnar electrodes 150A are distributed over a region Aa (a first region), a region Ab (a second region), and a region Ad on the module substrate 90. The region Aa is located between the side 100a and the side 190a facing the side 100a. The region Ab is located between the side 100b and the side 190b facing the side 100b. The region Ad is located between the side 100d and the side 190d facing the side 100d. The columnar electrodes 150B are disposed in a region Ac (a third region) on the module substrate 90. The region Ac is located between the side 100c and the side 190c facing the side 100c. None of the columnar electrodes 150A is disposed in the region Ac.

The via conductors 151 extend perpendicularly to the main surface 90b from a main surface 10b (a fourth main surface) of the semiconductor IC 10 to the surface of the resin member 80B (i.e., to the imaginary plane 100q) and are herein also referred to as third connection electrodes.

Some of the via conductors 151 are connected to a low-noise amplifier 41 through via electrodes 140. Some of the via conductors 151 are connected to land electrodes on the module substrate 90 through via electrodes 160, which extend through the semiconductor IC 10.

The low-noise amplifier 41 and the inductor 31 are closer to the side 100c than to the sides 100a, 100b, and 100d.

The columnar electrodes 150B disposed in the region Ac on the module substrate 90 and having a small cross-sectional area are supplemented with the via conductors 151 extending from the main surface 10b (a top face) of the semiconductor IC 10. This layout enables the radio-frequency module 1C to achieve area savings while helping ensure proper extraction of electrical signals, enhanced grounding, and secure mounting on an external board.

FIGS. 7A and 7B schematically illustrate the planar configuration and the sectional configuration of a radio-frequency module 1D according to a modification of Embodiment 3. FIG. 7A illustrates the layout of a semiconductor IC 10, columnar electrodes 150A, and columnar electrodes 150B on a module substrate 90 having a main surface 90a and a main surface 90b, with the main surface 90b being viewed from the negative side in the z-axis direction. FIG. 7B is a sectional view of the radio-frequency module 1D taken along line VII-VII in FIG. 7A. When the main surface 90a is viewed from the positive side in the z-axis direction, the circuit elements are placed in the layout illustrated in FIG. 3A, and a redundant illustration is eliminated.

As illustrated in FIGS. 7A and 7B, the radio-frequency module 1D according to this modification includes the module substrate 90, the semiconductor IC 10, the columnar electrodes 150A, the columnar electrodes 150B, via conductors 152, a filter 21, a filter 22, an inductor 31, a circuit element 51, a circuit element 52, a resin member 80A, a resin member 80B, and a shield electrode 70. Unlike the radio-frequency module 1 according to Embodiment 1, the radio-frequency module 1D in FIGS. 7A and 7B reveals the layout of elements in the semiconductor IC 10. The radio-frequency module 1D differs from the radio-frequency module 1 in that the via conductors 152 and the shield electrode 70 are disposed. Configurations common to the radio-frequency module 1D according to this modification and the radio-frequency module 1 according to Embodiment 1 will not be fully dealt with in the following description, which will be given while focusing on distinctive features of the radio-frequency module 1D.

When the module substrate 90 is viewed in section, the columnar electrodes 150A and 150B extend perpendicularly to the main surface 90b (i.e., in the z-axis direction) from the main surface 90b to an imaginary plane 100q (a second imaginary plane). The imaginary plane 100q is farther than an imaginary plane 100p (a first imaginary plane) from the main surface 90b. A surface of the resin member 80B lies in the imaginary plane 100q (the second imaginary plane).

The area of a cross section of each of the columnar electrodes 150B is smaller than the area of a cross section of each of the columnar electrodes 150A. The cross sections are parallel to the main surface 90b. In this modification, the columnar electrodes 150A and 150B each have a cylindrical shape, and the diameter of a cross section of each of the columnar electrodes 150B is smaller than the diameter of a cross section of each of the columnar electrodes 150A. The cross sections are parallel to the main surface 90b.

As illustrated in FIG. 7A, the columnar electrodes 150A are distributed over a region Aa (a first region), a region Ab (a second region), and a region Ad on the module substrate 90. The region Aa is located between the side 100a and the side 190a facing the side 100a. The region Ab is located between the side 100b and the side 190b facing the side 100b. The region Ad is located between the side 100d and the side 190d facing the side 100d. The columnar electrodes 150B are disposed in a region Ac (a third region) on the module substrate 90. The region Ac is located between the side 100c and the side 190c facing the side 100c. None of the columnar electrodes 150A is disposed in the region Ac.

The semiconductor IC 10 includes a digital control circuit 11. The digital control circuit 11 is closer to the side 100c than to the sides 100a, 100b, and 100d.

The via conductors 152 extend perpendicularly to the main surface 90b from a main surface 10b (a fourth main surface) of the semiconductor IC 10 to the surface of the resin member 80B (i.e., to the imaginary plane 100q) and are herein also referred to as third connection electrodes.

Some of the via conductors 152 are connected to the digital control circuit 11 through via electrodes 110.

The digital control circuit 11 disposed in an end portion of the semiconductor IC 10 does not require dedicated wiring in the module substrate 90, thus eliminating or reducing the possibility that digital noise (spurious radiation) will flow into other circuit elements through digital wiring. The via conductors 152 connected to a top face of the digital control circuit 11 are adjacent to the region Ac, in which none of the columnar electrodes 150A having a large cross-sectional area is disposed. This layout enables the radio-frequency module 1D to achieve area savings while helping ensure noise suppression, proper extraction of electrical signals, enhanced grounding, and secure mounting on an external board.

The radio-frequency module 1D according to this modification includes the shield electrode 70, which covers at least a lateral surface of the resin member 80B. The shield electrode 70 and a ground electrode 92G are connected to each other on the lateral surface.

The ground electrode 92G is a planar wiring pattern laid parallel to the main surfaces 90a and 90b of the module substrate 90.

The digital control circuit 11 that is disposed in the end portion of the semiconductor IC 10 and is in a region close to an end portion of the module substrate 90 can cause radiation of digital noise to the outside of the radio-frequency module.

As a workaround, the shield electrode 70 suppresses direct emission of noise from the radio-frequency module 1D to the outside, or more specifically, emission of radio-frequency signals from the semiconductor IC 10, and emission of noise from the digital control circuit 11 in particular. Furthermore, the shield electrode 70 eliminates or reduces the possibility that extraneous noise will enter the semiconductor IC 10. The shield electrode 70 provides a path for dissipation of heat from the semiconductor IC 10, and the radio-frequency module 1D has improved thermal dissipation properties accordingly.

The shield electrode 70 of the radio-frequency module 1D according to this modification is optional. The radio-frequency module 1C according to the present embodiment may include the shield electrode 70 and the ground electrode 92G.

The via conductors 151 in the present embodiment and the via conductors 152 in this modification may each have a cylindrical shape or may each be in the form of, for example, a prism. The via conductors 151 and 152 may be solder balls or connection electrodes such as bump electrodes. In such a case, the via conductors 151 and 152 may each have a spherical surface.

Other Embodiments

The radio-frequency module and the communication device according to the present invention are not limited to those described so far in Embodiments 1 to 3. The present invention embraces other embodiments implemented by varying combinations of constituent components of the embodiments above, modifications achieved through various alterations to the embodiments above that may be conceived by those skilled in the art within a range not departing from the spirit of the present invention, and various types of apparatuses including the radio-frequency module and the communication device according to the present disclosure.

In each of the radio-frequency modules and the communication device according to the embodiments above, the paths forming connections between the circuit elements and the signal paths illustrated in the drawings may have, for example, other circuit elements and wiring disposed thereon.

The semiconductor IC 10 herein may be a large-scale integrated circuit (LSI). Alternatively, dedicated circuitry or general purpose processors may be used for circuit integration. It is also possible to use a field-programmable gate array (FPGA), namely, an LSI that can be programmed after manufacture or to use a reconfigurable processor in which connections and settings of circuit cells within an LSI can be reconfigured. Furthermore, if another integration technology becomes available as a replacement for large-scale integration owing to the advancement of semiconductor technology or other derivative technologies, it is certainly possible to use such a technology to integrate functional blocks.

The present invention may be adopted into radio-frequency modules required to meet the need for increased miniaturization and thus has wide applicability to communication apparatuses such as mobile phones.

While preferred embodiments of the invention have been described above, it is to be understood that variations and modifications will be apparent to those skilled in the art without departing from the scope and spirit of the invention. The scope of the invention, therefore, is to be determined solely by the following claims.

What is claimed is:

1. A radio-frequency module comprising:
a module substrate having a first main surface and a second main surface;
a semiconductor integrated circuit having a third main surface and a fourth main surface, the semiconductor integrated circuit being mounted on the first main surface with the third main surface being located between the module substrate and the fourth main surface, the semiconductor integrated circuit being configured to process radio-frequency signals;
first connection electrodes extending perpendicularly to the first main surface from the first main surface to at least a first imaginary plane in which the fourth main surface lies; and
second connection electrodes extending perpendicularly to the first main surface from the first main surface to at least the first imaginary plane, an area of a second cross section of each of the second connection electrodes being smaller than an area of a first cross section of each of the first connection electrodes, the first and second cross sections being parallel to the first main surface, wherein
when the module substrate is viewed in plan,
the semiconductor integrated circuit has a periphery including a first side, a second side, a third side, and a fourth side, the first and second sides being parallel to each other, the third and fourth sides being parallel to each other and being orthogonal to the first and second sides,
some of the first connection electrodes are disposed in a first region on the module substrate, the first region being located between the first side and a side that is one of sides constituting a periphery of the module substrate and that faces the first side,
some of the first connection electrodes are disposed in a second region on the module substrate, the second region being located between the second side and a side that is one of the sides constituting the periphery of the module substrate and that faces the second side, and
some of the second connection electrodes are disposed in a third region on the module substrate, the third region being located between the third side and a side that is one of the sides constituting the periphery of the module substrate and that faces the third side, none of the first connection electrodes being disposed in the third region.

2. The radio-frequency module according to claim 1, wherein
some of the second connection electrodes are disposed in a fourth region on the module substrate, the fourth region being located between the fourth side and a side that is one of the sides constituting the periphery of the module substrate and that faces the fourth side, none of the first connection electrodes being disposed in the fourth region.

3. The radio-frequency module according to claim 1, wherein
when the module substrate is viewed in plan, a distance between the third side and the side being one of the sides of the module substrate and defining the third region is smaller than a distance between the first side and the side being one of the sides of the module substrate and defining the first region and is smaller than a distance between the second side and the side being one of the sides of the module substrate and defining the second region.

4. The radio-frequency module according to claim 2, wherein
when the module substrate is viewed in plan, a distance between the third side and the side being one of the sides of the module substrate and defining the third region is smaller than a distance between the first side and the side being one of the sides of the module substrate and defining the first region and is smaller than a distance between the second side and the side being one of the sides of the module substrate and defining the second region.

5. The radio-frequency module according to claim 1, further comprising a first component mounted on the second main surface, wherein
the first component and the semiconductor integrated circuit are connected to each other through a via conductor located in the module substrate and extending perpendicularly to the first main surface.

6. The radio-frequency module according to claim 2, further comprising a first component mounted on the second main surface, wherein
the first component and the semiconductor integrated circuit are connected to each other through a via conductor located in the module substrate and extending perpendicularly to the first main surface.

7. The radio-frequency module according to claim 3, further comprising a first component mounted on the second main surface, wherein
the first component and the semiconductor integrated circuit are connected to each other through a via conductor located in the module substrate and extending perpendicularly to the first main surface.

8. The radio-frequency module according to claim 5, wherein when the module substrate is viewed in plan, the via conductor is closer to the third side than to the first side, the second side, and the fourth side.

9. The radio-frequency module according to claim 5, wherein
the semiconductor integrated circuit includes an amplifier circuit that amplifies radio-frequency signals, and
when the module substrate is viewed in plan, the amplifier circuit and the first component are closer to the third side than to the first side, the second side, and the fourth side.

10. The radio-frequency module according to claim 8, wherein
the semiconductor integrated circuit includes an amplifier circuit that amplifies radio-frequency signals, and
when the module substrate is viewed in plan, the amplifier circuit and the first component are closer to the third side than to the first side, the second side, and the fourth side.

11. The radio-frequency module according to claim 9, wherein
the amplifier circuit includes a low-noise amplifier, and
the first component is an inductor connected to an input terminal of the low-noise amplifier.

12. The radio-frequency module according to claim 1, further comprising a third connection electrode, wherein
the first connection electrodes and the second connection electrodes extend to a second imaginary plane that is farther from the first main surface than the first imaginary plane, and
the third connection electrode extends perpendicularly to the first main surface from the fourth main surface to the second imaginary plane.

13. The radio-frequency module according to claim 2, further comprising a third connection electrode, wherein
the first connection electrodes and the second connection electrodes extend to a second imaginary plane that is farther from the first main surface than the first imaginary plane, and
the third connection electrode extends perpendicularly to the first main surface from the fourth main surface to the second imaginary plane.

14. The radio-frequency module according to claim 3, further comprising a third connection electrode, wherein
the first connection electrodes and the second connection electrodes extend to a second imaginary plane that is farther from the first main surface than the first imaginary plane, and
the third connection electrode extends perpendicularly to the first main surface from the fourth main surface to the second imaginary plane.

15. The radio-frequency module according to claim 12, wherein
the semiconductor integrated circuit includes a digital control circuit that supplies a digital control signal to an element incorporated in the semiconductor integrated circuit,
when the module substrate is viewed in plan, the digital control circuit is closer to the third side than to the first side, the second side, and the fourth side, and
the third connection electrode is connected to the digital control circuit.

16. The radio-frequency module according to claim 1, further comprising:
a resin member disposed on the first main surface, at least a part of the semiconductor integrated circuit being covered with the resin member;
a ground electrode that is a planar wiring pattern in the module substrate; and
a shield electrode that covers at least a lateral surface of the resin member, the shield electrode and the ground electrode being connected to each other on the lateral surface.

17. The radio-frequency module according to claim 2, further comprising:
a resin member disposed on the first main surface, at least a part of the semiconductor integrated circuit being covered with the resin member;
a ground electrode that is a planar wiring pattern in the module substrate; and
a shield electrode that covers at least a lateral surface of the resin member, the shield electrode and the ground electrode being connected to each other on the lateral surface.

18. The radio-frequency module according to claim 3, further comprising:
a resin member disposed on the first main surface, at least a part of the semiconductor integrated circuit being covered with the resin member;
a ground electrode that is a planar wiring pattern in the module substrate; and
a shield electrode that covers at least a lateral surface of the resin member, the shield electrode and the ground electrode being connected to each other on the lateral surface.

19. A communication device comprising:
a radio-frequency signal processing circuit that processes radio-frequency signals transmitted or received via an antenna element; and
the radio-frequency module according to claim 1, the radio-frequency module being configured to transmit the radio-frequency signals between the antenna element and the radio-frequency signal processing circuit.

20. A communication device comprising:
a radio-frequency signal processing circuit that processes radio-frequency signals transmitted or received via an antenna element; and
the radio-frequency module according to claim 2, the radio-frequency module being configured to transmit the radio-frequency signals between the antenna element and the radio-frequency signal processing circuit.

* * * * *